US010160014B2

(12) United States Patent
Kobayashi et al.

(10) Patent No.: US 10,160,014 B2
(45) Date of Patent: Dec. 25, 2018

(54) CHUCK CLEANER AND CLEANING METHOD

(71) Applicant: Toshiba Memory Corporation, Tokyo (JP)

(72) Inventors: Yoshihito Kobayashi, Tokyo (JP); Masamitsu Ito, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 778 days.

(21) Appl. No.: 14/479,736

(22) Filed: Sep. 8, 2014

(65) Prior Publication Data
US 2015/0107621 A1    Apr. 23, 2015

(30) Foreign Application Priority Data
Oct. 18, 2013   (JP) .................................. 2013-217732

(51) Int. Cl.
| B08B 7/00 | (2006.01) |
| G03F 7/20 | (2006.01) |
| H01L 21/67 | (2006.01) |
| H01L 21/687 | (2006.01) |

(52) U.S. Cl.
CPC ............ B08B 7/0028 (2013.01); G03F 7/707 (2013.01); G03F 7/70925 (2013.01);
(Continued)

(58) Field of Classification Search
CPC ......... A47L 25/005; B08B 1/00; B08B 1/001; B08B 7/00; B08B 7/0014; B08B 7/0028; B08B 11/00; B08B 11/04; G03F 7/70925; H01L 21/02041; H01L 21/02043; H01L 21/02046; H01L 21/02057; H01L 21/02076; H01L 21/02079;
(Continued)

(56) References Cited

U.S. PATENT DOCUMENTS

| 7,909,374 | B2 * | 3/2011 | Thallner ............. H01L 21/6838 294/212 |
| 2006/0162739 | A1 * | 7/2006 | Sogard .................. B08B 7/0014 134/1 |

(Continued)

FOREIGN PATENT DOCUMENTS

| JP | 8-88206 | * | 4/1996 |
| JP | 8-88209 | * | 4/1996 |

(Continued)

*Primary Examiner* — Mark Spisich
(74) *Attorney, Agent, or Firm* — Finnegan, Henderson, Farabow, Garrett & Dunner, L.L.P.

(57) ABSTRACT

According to one embodiment, a chuck cleaner includes a support, an adhesive layer, and a support substrate. The support includes a first portion, a second portion, and a third portion provided between the first portion and the second portion. The support substrate is provided between the support and the adhesive layer. The support substrate includes a first region fixed to the first portion, a second region fixed to the second portion, a third region provided between the first region and the second region and having variable distance from the third portion, a fourth region provided between the first region and the third region and separated from the support, and a fifth region provided between the second region and the third region and separated from the support.

9 Claims, 4 Drawing Sheets

(52) U.S. Cl.
CPC .. *H01L 21/67028* (2013.01); *H01L 21/67132* (2013.01); *H01L 21/6875* (2013.01)

(58) Field of Classification Search
CPC ......... H01L 21/02082; H01L 21/02096; H01L 21/02301; H01L 21/02334; H01L 21/02661; H01L 21/6875; H01L 21/67132; H01L 21/67028; H01L 21/4892; H01L 21/67092; H01L 21/683; H01L 21/687
USPC ................. 15/3, 100, 102, 104.002; 294/212
See application file for complete search history.

(56) References Cited

U.S. PATENT DOCUMENTS

| | | |
|---|---|---|
| 2008/0229948 A1 | 9/2008 | Washiya et al. |
| 2012/0024318 A1 | 2/2012 | Itoh et al. |
| 2014/0326278 A1* | 11/2014 | Kobayashi ............ B08B 7/0014 134/6 |

FOREIGN PATENT DOCUMENTS

| | | |
|---|---|---|
| JP | 10-154686 | 6/1998 |
| JP | 2004-241568 | 8/2004 |
| JP | 2008-147337 | 6/2008 |
| JP | 2008-230027 | 10/2008 |
| JP | 2008-300683 | 12/2008 |
| JP | 2009-146959 | 7/2009 |
| JP | 2013-74125 | 4/2013 |
| WO | WO2013/035415 | 3/2013 |

* cited by examiner

CHUCK CLEANER AND CLEANING METHOD

CROSS-REFERENCE TO RELATED APPLICATIONS

This application is based upon and claims the benefit of priority from the Japanese Patent Application No. 2013-217732, filed on Oct. 18, 2013; the entire contents of which are incorporated herein by reference.

FIELD

Embodiments described herein relate generally to a chuck cleaner and a cleaning method.

BACKGROUND

There is, for example, a cleaning method in which a substrate with an adhesive material fixed thereto is carried to remove foreign matters from a carrying system and a processing unit or the like (such as chuck) within a semiconductor processing device. A chuck cleaner and a cleaning method that can securely remove foreign matters are demanded.

DETAILED DESCRIPTION

According to one embodiment, a chuck cleaner includes a support, an adhesive layer, and a support substrate. The support includes a first portion, a second portion, and a third portion provided between the first portion and the second portion. The support substrate is provided between the support and the adhesive layer. The support substrate includes a first region fixed to the first portion, a second region fixed to the second portion, a third region provided between the first region and the second region and having variable distance from the third portion, a fourth region provided between the first region and the third region and separated from the support, and a fifth region provided between the second region and the third region and separated from the support.

Various embodiments will be described hereinafter with reference to the accompanying drawings.

The drawings are schematic or conceptual, in which the relation between thickness and width of each part, the proportion in size between parts and the like are not necessarily the same as reality. Moreover, in some cases, even the same part may be depicted with different dimensions and proportions, depending on the drawings.

In the specification and each of the drawings, an element that is the same as the one described with reference to an already mentioned drawing is denoted by the same reference sign and detailed description thereof is omitted when appropriate.

An embodiment of the invention relates to a chuck cleaner used to clean a device. The embodiment also relates to a cleaning method using a chuck cleaner.

First Embodiment

Figure 1A:
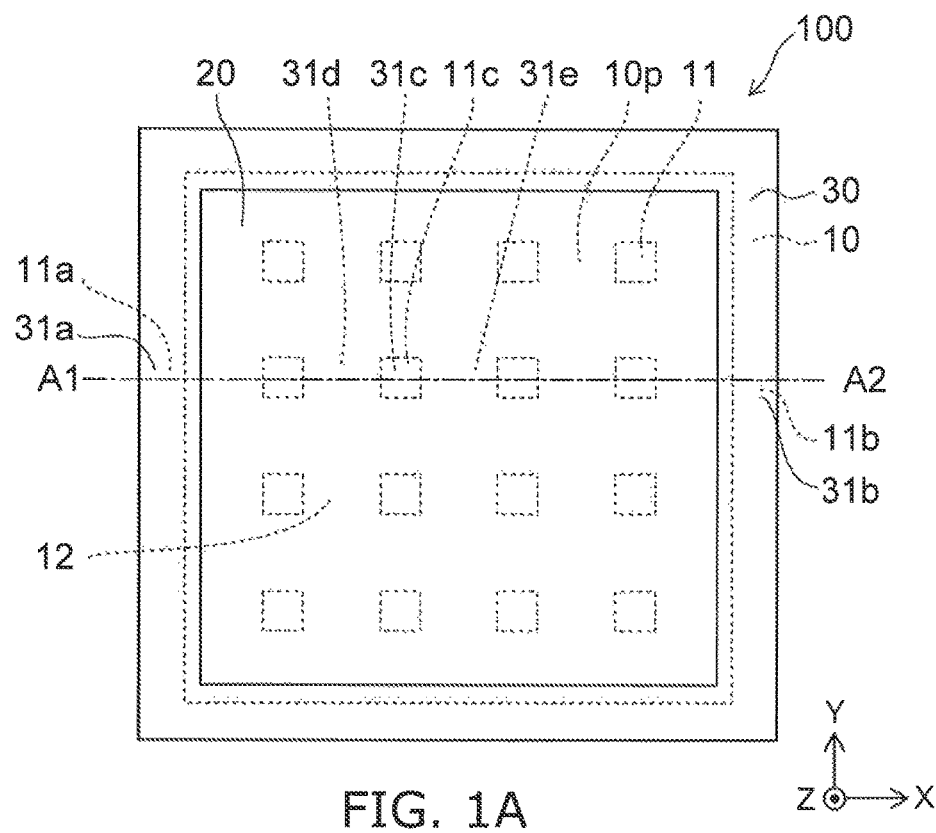
FIG. 1A and FIG. 1B are schematic views illustrating a chuck cleaner according to a first embodiment.
Figure 1B:
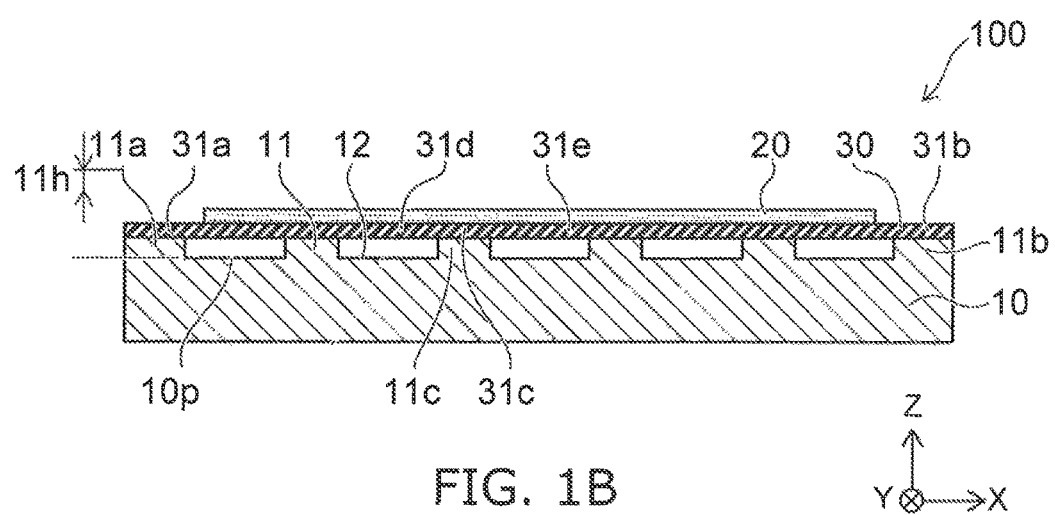

FIG. 1A and FIG. 1B are schematic views illustrating a chuck cleaner according to a first embodiment.

FIG. 1A is a perspective plan view illustrating a chuck cleaner 100. FIG. 1B is a schematic cross-sectional view illustrating the chuck cleaner 100. FIG. 1B illustrates the cross section taken along A1-A2 in FIG. 1A.

As shown in FIG. 1A and FIG. 1B, the chuck cleaner 100 includes a support 10, an adhesive layer 20, and a support substrate 30. The support substrate 30 is provided between the support 10 and the adhesive layer 20. The adhesive layer 20 is stacked, for example, on the support substrate 30.

The support 10 has a face 10p. For example, plural protrusions 11 are provided on the support 10. The support 10 includes a first portion 11a, a second portion 11b, and a third portion 11c. The third portion 11c is provided between the first portion 11a and the second portion 11b.

The direction toward the adhesive layer 20 from the support 10 is defined as a Z-axis direction. A perpendicular direction to the Z-axis direction is defined as an X-axis direction. The direction that is perpendicular to the X-axis direction and perpendicular to the Z-axis direction is defined as a Y-axis direction.

The first portion 11a, the second portion 11b, and the third portion 11c are a first protrusion, a second protrusion, and a third protrusion, respectively. The first protrusion and the second protrusion may be continuous with each other. The third protrusion may be continuous with the first protrusion or may be continuous with the second protrusion.

For example, when the support 10 is cut on a plane including the Z-axis direction, the first protrusion (first portion 11a) is separated from the second protrusion (second portion 11b). For example, when the support 10 is cut on a plane including the Z-axis direction, the third protrusion (third portion 11c) is separated from the first protrusion (first portion 11a). When the support 10 is cut on a plane including the Z-axis direction, the third protrusion (third portion 11c) is separated from the second protrusion (second portion 11b).

In this example, the first portion 11a and the second portion 11b are provided on the outer side of the support 10, as projected on an X-Y plane.

The support substrate 30 includes a first region 31a, a second region 31b, a third region 31c, a fourth region 31d, and a fifth region 31e. The first region 31a is disposed on the first portion 11a. The second region 31b is disposed on the second portion 11b. The third region 31c is disposed on the third portion 11c.

In this example, the first region 31a is fixed to the first portion 11a. The second region 31b is fixed to the second portion 11b. The third region 31c is provided between the first region 31a and the second region 31b. The distance between the third region 31c and the third portion 11c is variable. The fourth region 31d is provided between the first region 31a and the third region 31c. The fourth region 31d is separated from the support 10. The fifth region 31e is provided between the second region 31b and the third region 31c. The fifth region 31e is separated from the support 10.

For example, the protrusions 11 are provided in such a way that the spacing between the respective protrusions 11 is equal. The plural protrusions 11 may be disposed on concentric circles on the X-Y plane. The spacing between the respective protrusions 11 may not be constant.

For the support 10, for example, a metal, resin, quartz, ceramic or the like is used. The support 10 is not limited to these, and a material that can be processed smoothly and has high rigidity is used for the support 10.

The support substrate 30 is deformable. For example, the support substrate 30 has flexibility. For example, a glass substrate or silicon wafer is used for the support substrate 30. The support substrate 30 is not limited to the glass substrate and silicon wafer, and a material that can be processed into a smooth sheet or a material that can be processed into a smooth film is used for the support substrate 30. A resin may also be used for the support substrate 30. As such a resin, for example, polyvinyl chloride, polyethylene, polypropylene, polyester, ethylene vinyl alcohol, polyurethane, ionomer, polyamide, polyimide, polyethylene terephthalate (PET) or the like is used. For the support substrate 30, a melted mixture of plural resins, or a copolymer of plural resins may also be used. The support substrate 30 may have a multilayer structure including plural resin layers.

The adhesive layer 20 has adhesiveness. For example, an adhesive is used for the adhesive layer 20. The adhesive is, for example, an adhesive containing a methacrylic acid ester polymer as a principal component. The adhesive is, for example, a urethane-based, polyester-based, epoxy-based, polyvinyl chloride-based, melamine-based, polyimide-based, or silicone-based adhesive or the like. A tackifier, hardener, plasticizer, anti-polymerizer, anti-aging agent or the like may be added into the adhesive.

The adhesive layer 20 on the support substrate 30 is formed, for example, by spin coating. The formation of the adhesive layer 20 by spin coating uses, for example, a toluene-ethyl acetate solution. The principal component of the toluene-ethyl acetate solution is, for example, an acrylic acid ester copolymer. As the cross-linker of the toluene-ethyl acetate solution, for example, an isocyanate compound is used. To form the adhesive layer 20, a gravure coater, comma coater, bar coater, knife coater, roll coater, capillary coater, letterpress printing, intaglio printing, planography, flexography, offset printing, screen printing, spraying or the like may be used.

A technique of transferring an adhesive applied in advance on a film to the substrate may also be used to form the adhesive layer 20.

The adhesive applied on the support substrate 30 is dried to form the adhesive layer 20. The thickness of the adhesive layer 20 after drying is, for example, 0.5 μm or more and 15.0 μm or less, and preferably 2 μm or more and 5 μm or less.

The chuck cleaner 100 according to the embodiment is used, for example, to clean a semiconductor processing device (semiconductor manufacturing device or semiconductor inspection device). The semiconductor device is, for example, an extreme ultraviolet (EUV) exposure device, sputtering device, ion implantation device, dry etching device, wafer prober, ozone asher, resist coater, oxidation/diffusion furnace, normal pressure CVD (chemical vapor deposition) device, reduced CVD device, pattern lithography system, nanoimprint device, plasma CVD device or the like.

For example, the adhesive layer 20 of the chuck cleaner 100 is made to contact a cleaning target part (described later) in the device. After that, the adhesive layer is separated (stripped off) from the cleaning target part. This causes foreign matters adhering to the cleaning target part of the device to adhere to the adhesive layer 20. The device can thus be cleaned.

An example of a method for cleaning a reticle chuck of an EUV exposure device, using the chuck cleaner according to the embodiment, will be described.

FIG. 2A to FIG. 2D are schematic views illustrating the cleaning method using the chuck cleaner according to the first embodiment.

Figure 2A:
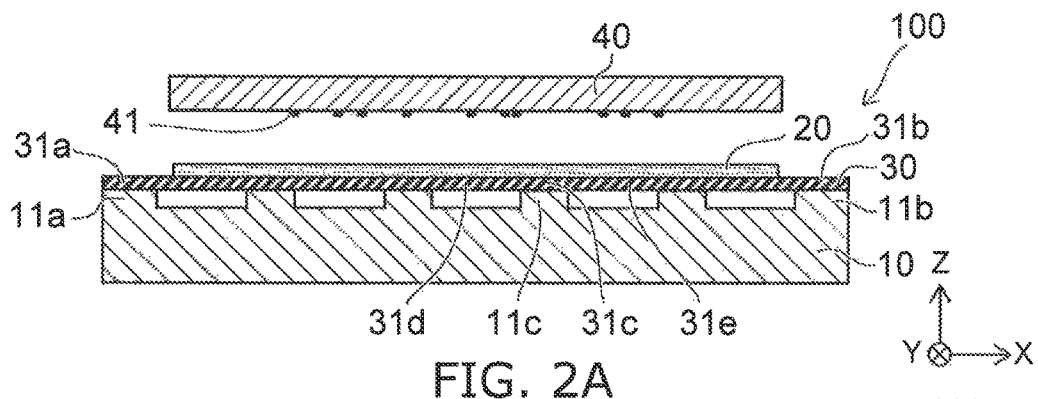
FIG. 2A to FIG. 2D are schematic views illustrating the cleaning method using the chuck cleaner according to the first embodiment.

As shown in FIG. 2A, the chuck cleaner 100 cleans a cleaning target part 40. The cleaning target part 40 is, for example, a chuck part. The chuck part holds, for example, a holding target (reticle or the like). The cleaning target part 40 is, for example, a reticle chuck (chuck part) of an EUV exposure device. The area of the adhesive layer 20 is, for example, approximately the same as the area of the cleaning target part, or larger than the area of the cleaning target part.

The chuck cleaner 100 is carried, for example, into the EUV exposure device by the mechanism of the EUV exposure device. At this time, for example, the inside of the EUV exposure device is in an exhausted state (vacuum state). For example, a cleaning target part (reticle chuck, chuck part) is provided in the EUV exposure device. Foreign matters 41 are adhering to the surface of the target cleaning part 40.

As shown in FIG. 2A, the chuck cleaner 100 is carried below the reticle chuck 40 of the EUV exposure device.

Figure 2B:
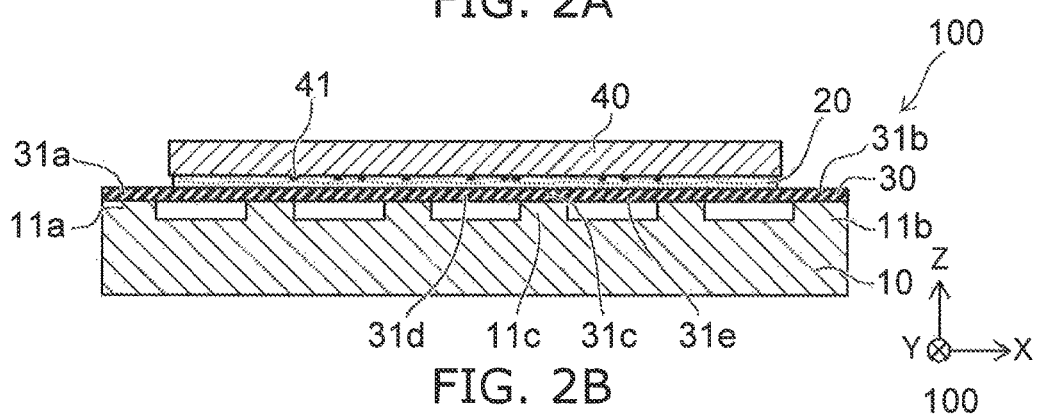

As shown in FIG. 2B, the chuck cleaner 100 is pressed against the cleaning target part 40 from below. The adhesive layer 20 of the chuck cleaner 100 and the cleaning target part 40 contact each other. For example, the adhesive layer 20 is made to tightly contact the cleaning target part 40 and is thus bonded thereto. The foreign matters 41 adhering to the cleaning target part 40 now adhere to the adhesive layer 20. The foreign matters 41 adhering to the adhesive layer 20 sink into the adhesive of the adhesive layer 20. The foreign matters 41 are taken in the adhesive layer 20.

Figure 2C:
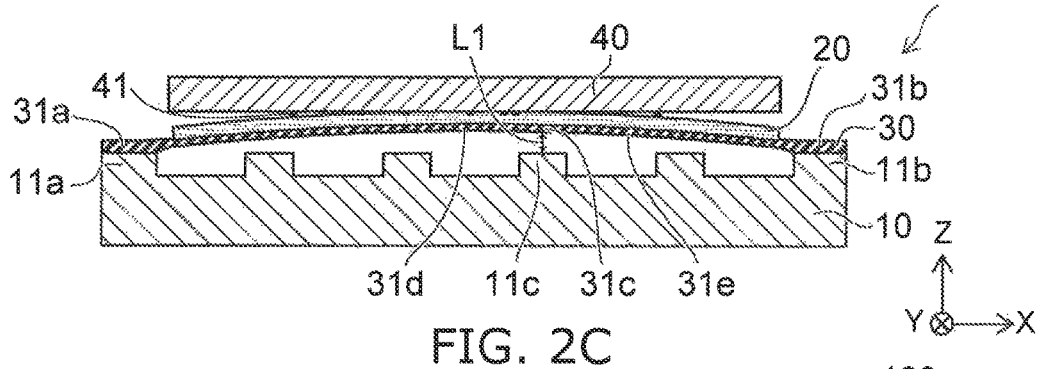

The pressure with which to press the chuck cleaner 100 against the cleaning target part 40 is eliminated. The support 10 of the chuck cleaner 100 falls. The first portion 11a and the second portion 11b fall. At this point, the first region 31a fixed to the first portion 11a and the second region 31b fixed to the second portion 11b fall, as shown in FIG. 2C. Meanwhile, the third region 31c loses its support. A gap is generated between the support 10 and the support substrate 30. When the adhesive layer 20 is stripped off, the support substrate 30 is deformed. For example, a first distance L1 between the third region 31c and the third portion 11c becomes longer. For example, the first distance L1 in the state where the adhesive layer 20 is separated (stripped off) from the cleaning target part 40 is longer than the first distance L1 in the state where the adhesive layer 20 is in contact with (pressed against) the cleaning target part 40. Flexure occurs in the support substrate 30.

Flexure occurs in the adhesive layer 20 provided on the support substrate 30. The resulting flexure triggers the stripping of the adhesive layer 20 from the cleaning target part 40. The stripping of the adhesive layer 20 from the cleaning target part 40 progresses.

Figure 2D:
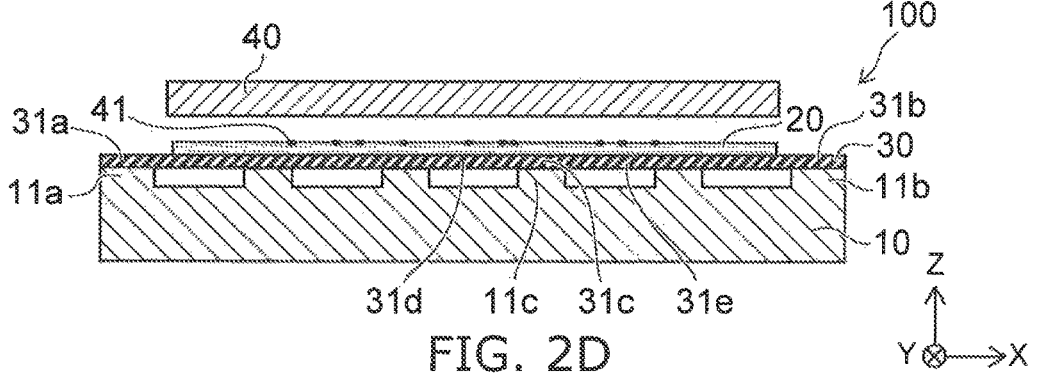

As the adhesive layer 20 is completely stripped off from the cleaning target part 40, as shown in FIG. 2D, since the foreign matters are adhering to the adhesive layer 20, the foreign matters 41 are removed from the cleaning target part 40. That is, the foreign matters 41 are moved from the cleaning target part 40 (chuck part) to the adhesive layer 20.

As the protrusions 11 and recesses 12 are thus provided, flexure occurs in the adhesive layer 20. The resulting flexure triggers the stripping, facilitating the stripping of the chuck cleaner 100 from the cleaning target part 40.

Recently semiconductors are increasingly miniaturized. In manufacturing and inspection processes of semiconductor devices, foreign matters adhere not only to the surface side of a wafer but also to the back side of the wafer and the inside of a wafer processing device. For example, in a wafer cleaning process, foreign matters adhering to the inside of the processing device and the back side of the wafer may shift to the surface side of the wafer. Some foreign matters may cause failure such as defocusing in a photolithography process.

For example, in a wafer etching process and a wafer sputtering process, the temperature of the wafer is controlled. This improves uniformity of the process within the wafer face. For example, if foreign matters are adhering to the back side of the wafer and the inside of the processing device, the spacing between the wafer and the wafer stage lacks uniformity, which may result in an inability to perform sufficient temperature control.

For example, in pattern formation using a nanoimprint device, the space between a template and a wafer is filled with an imprint agent. The imprint agent is hardened and the template is released. A pattern is thus formed. The spacing between the template and the wafer controls the thickness of the pattern. For example, if foreign matters are adhering to the back side of the wafer and the back side of the template, the spacing between the wafer and the template lacks uniformity. This may result in an inability to control the thickness of the pattern sufficiently.

For cleaning foreign matters adhering to the inside of the processing device, there is a technique according to a reference example in which the processing device is stopped and then cleaned. In this technique, the operating rate of the processing device falls. It takes much time and effort to operate the processing device again after the device is stopped and cleaned.

For example, an EUV exposure device is stopped and the inside of the vacuum chamber of the EUV exposure device is returned to atmospheric pressure. Next, a reticle chuck is taken out of the vacuum chamber and cleaned. In this technique, the device is stopped for a long time. The operating rate of the device falls and the manufacturing efficiency of semiconductor devices falls.

Meanwhile, in the cleaning with the chuck cleaner 100 according to the embodiment, the processing device is not stopped. The chuck cleaner 100 is carried into the processing device by the mechanism of the device. The chuck cleaner 100 is carried into the EUV exposure device, for example, without returning the inside of the vacuum chamber of the EUV exposure device to atmospheric pressure. The chuck cleaner 100 thus carried is made to contact the cleaning target part 40 and then stripped off. The cleaning target part 40 can thus be cleaned.

The use of the chuck cleaner 100 according to the embodiment enables cleaning of the inside of the processing device without stopping the device for a long time. The operating rate of the processing device can be improved and the manufacturing efficiency of semiconductor devices can be improved.

For example, there is a chuck cleaner according to a reference example in which a support, an adhesive layer, and a support substrate are provided as in the chuck cleaner 100 according to the embodiment, and in which no recesses or protrusions are provided on the support substrate. When this chuck cleaner is used, the chuck cleaner may not be able to be stripped off after being pressed against a reticle chuck. In the case where no recesses or protrusions are provided, the support substrate and the adhesive layer do not flex at the time of stripping, generating no trigger for the stripping. The chuck cleaner and the reticle chuck may not be stripped off from each other, resulting in an inability to carry the chuck cleaner continuously.

Meanwhile, if the adhesive strength of the adhesive layer 20 is weakened in order to prevent such a problem, removal of foreign matters is insufficient. That is, it is difficult to remove foreign matters securely.

In contrast, in the chuck cleaner 100 according to the embodiment, the protrusions 11 are provided. A gap is provided between the support substrate 30 and the support 10. Therefore, when the adhesive layer 20 is made to contact the cleaning target part and then is stripped off, flexure occurs in the support substrate 30 and the adhesive layer 20. The resulting flexure in the adhesive layer 20 triggers the stripping. The adhesive layer 20 can be easily stripped off even if the adhesive layer 20 and the cleaning target part adhere to each other firmly. The chuck cleaner 100 can be carried continuously.

The chuck cleaner 100 in which the protrusions 11 are provided can clean the inside of the processing device without stopping the processing device, and can be easily stripped off from the cleaning target part. According to the embodiment, a chuck cleaner which can securely remove foreign matters is provided. Also, easy stripping can be realized and easy and convenient cleaning can be realized.

For example, the protrusion 11 has a height 11$h$. The height 11$h$ is, for example, the difference between the position on the Z axis of the protrusion 11 and the position on the Z axis of the recess 12. It is favorable that the height 11$h$ is 0.01 mm or more and 50 mm or less. It is preferable that the height 11$h$ of the protrusion 11 is 0.5 mm or more and 20 mm or less.

If the height 11$h$ of the protrusion 11 is 0.01 mm or less, the deformation of the adhesive layer 20 and the support substrate 30 may be insufficient when stripping off the chuck cleaner 100 from the cleaning target part. No trigger for the stripping of the adhesive layer 20 may be generated, making it difficult to strip off the chuck cleaner.

If the height 11$h$ of the protrusion 11 is 50 mm or more, the support substrate 30 may be deformed excessively when bringing the adhesive layer 20 and the cleaning target part into contact with each other. It is difficult to cause the adhesive layer 20 to tightly contact the cleaning target part, which may make it difficult to remove foreign matters.

Second Embodiment

Figure 3A:
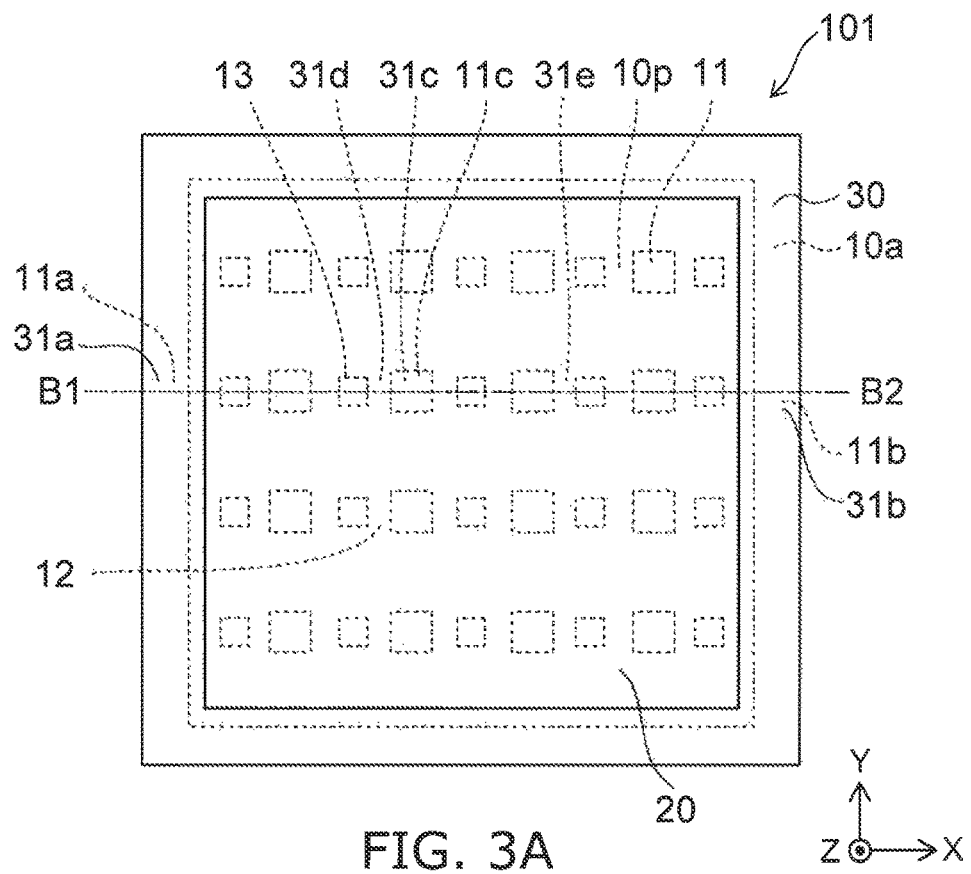
FIG. 3A and FIG. 3B are schematic views illustrating a chuck cleaner according to a second embodiment.
Figure 3B:
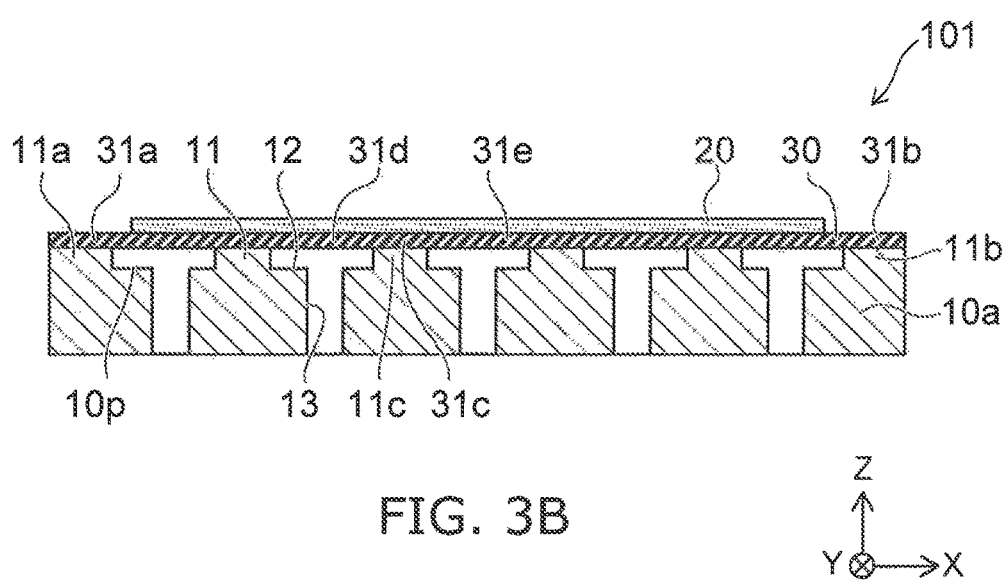

FIG. 3A and FIG. 3B are schematic views illustrating a chuck cleaner according to a second embodiment.

FIG. 3A is a perspective plan view illustrating a chuck cleaner 101. FIG. 3B illustrates the cross section taken along B1-B2 in FIG. 3A.

As shown in FIG. 3A, the chuck cleaner 101 includes a support 10$a$, an adhesive layer 20, and a support substrate 30. As shown in FIG. 3B, the support substrate 30 is provided between the support 10$a$ and the adhesive layer 20. The support 10$a$ includes a face 10$p$ and a through-hole 13.

The support 10$a$ includes a first portion 11$a$, a second portion 11$b$, and a third portion 11$c$. The support substrate 30 includes a first region 31$a$, a second region 31$b$, a third region 31$c$, a fourth region 31$d$, and a fifth region 31$e$.

The configurations described with respect to the chuck cleaner 100 can be applied to the adhesive layer 20, the support substrate 30, the first portion 11$a$, the second portion 11b, the third portion 11c, the first region 31a, the second region 31b, the third region 31c, the fourth region 31d, and the fifth region 31e.

The through-hole 13 penetrates the support 10a. The through-hole 13 is provided in the plane 10p, for example, in the region between the region where the first portion 11a is provided and the region where the third portion lie is provided. The through-hole 13 may be provided in a plural number. For example, the through-holes 13 may be provided between the first portion 11a and the third portion 11c and between the second portion 11b and the third portion 11c.

The cleaning method for the processing device using the chuck cleaner 101 is similar to the first embodiment.

In the cleaning with the chuck cleaner 101, a gas can pass through the through-hole 13 when bringing the adhesive layer 20 into contact with the cleaning target part and then stripped off the adhesive layer 20. Thus, when stripping the adhesive layer 20, flexure can easily occur in the support substrate 30. Flexure can easily occur in the adhesive layer 20 provided on the support substrate 30. The resulting flexure in the adhesive layer 20 triggers the stripping. Therefore, the adhesive layer 20 can be easily stripped off even if the adhesive layer 20 and the cleaning target part adhere to each other firmly.

The chuck cleaner 101 can clean the inside of the processing device without stopping the processing device and can be easily stripped off from the cleaning target part. According to the embodiment, a chuck cleaner which can securely remove foreign matters is provided. Also, the stripping is facilitated and easy and convenient cleaning can be realized.

Third Embodiment

Figure 4:
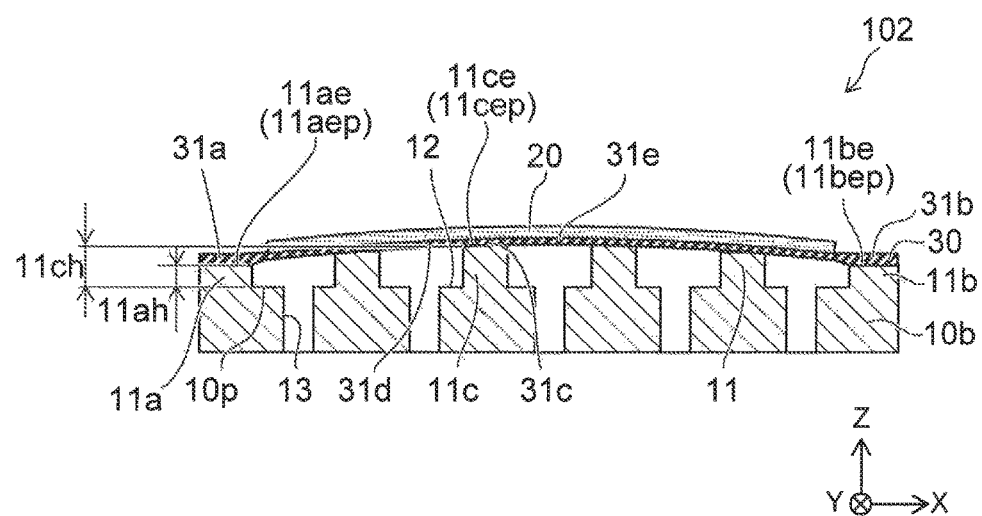
FIG. 4 is a schematic cross-sectional view illustrating a chuck cleaner according to a third embodiment.

FIG. 4 is a schematic cross-sectional view illustrating a chuck cleaner according to a third embodiment.

As shown in FIG. 4, a chuck cleaner 102 includes a support 10b, an adhesive layer 20, and a support substrate 30.

The support 10b includes a face lop and a through-hole 13. For example, plural protrusions 11 are provided on the support 101o. The support 10b includes a first portion 11a, a second portion 11b, and a third portion 11c. The support substrate 30 includes a first region 31a, a second region 31b, a third region 31c, a fourth region 31d, and a fifth region 31e.

The configurations described with respect to the chuck cleaner 101 can be applied to the adhesive layer 20, the support substrate 30, the first portion 11a, the second portion 11b, the third portion 11c, the through-hole 13, the first region 31a, the second region 31b, the third region 31c, the fourth region 31d, and the fifth region 31e.

A height 11ch of the third portion 11c is different from a height 11ah of the first portion 11a. For example, the third portion 11c is taller than the first portion 11a.

The first portion 11a has a first end 11ae located on the side of the first region 31a. The first end 11ae opposes the first region 31a.

The second portion 11b has a second end 11be located on the side of the second region 31b. The second end 11be opposes the second region 31b.

The third portion 11c has a third end 11ce located on the side of the third region 31c. The third end 11ce opposes the third region 31c.

A position 11cep on the Z axis of the end 11ce is disposed between a position 11aep on the Z axis of the first end 11ae and the position on the Z axis of the adhesive layer 20.

The position 11cep is disposed between a position 11bep on the Z axis of the end 11be and the position on the Z axis of the adhesive layer 20.

For example, the height 11ch of the third portion 11c can be adjusted. For example, the position 11cep is variable. To adjust the height, for example, the protrusion 11 may be replaced by a protrusion 11 fabricated with a different height in advance. A mechanism to adjust the height of the protrusion 11 with a screw or the like may be provided on the support 10b.

The method for cleaning the processing device with the chuck cleaner 102 or the like is similar to the first embodiment.

For example, of the plural protrusions 11, the protrusion 11 situated near the center of the face 10p in the X-Y plane is adjusted to be taller. Thus, a part of the adhesive layer 20 can be pressed against the cleaning target part.

The height 11h of each protrusion 11 is adjusted individually to cause the support substrate 30 to flex in such a way that the center part forms a protruding shape in advance. Thus, it is possible to bring only a part of the adhesive layer 20 into contact with the cleaning target part. For example, the adhesive layer 20 can be made to contact only a part of the cleaning target part. For example, if foreign matters are adhering only to a center part of a reticle chuck, the adhesive layer 20 is made to contact only the center part of the reticle chuck. It is possible to clean only the center part of the reticle chuck. A desired position on the cleaning target part can be selectively cleaned. According to the embodiment, a chuck cleaner which can securely remove foreign matters is provided. Also, the stripping is facilitated and easy and convenient cleaning can be realized.

According to the embodiments, a chuck cleaner and a cleaning method that enable secure removable of foreign matters are provided.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A chuck cleaner comprising:
a support, the support including
first and second raised portions disposed at opposed perimeter portions thereof,
a plurality of-third raised portions, and
a plurality of recessed portions defined between respective adjacent third raised portions as well as between the first and the second raised portions and the third raised portions;
an adhesive layer; and
a support substrate provided between the support and the adhesive layer, peripheral portions of the support substrate being fixed to the first and second raised portions of the support, a bottom surface of an inner region of the support substrate being adapted to engage an upper surface of each of the third plurality of raised portions in a first orientation and be spaced from the upper surface of each of the third plurality of raised portions in a second orientation,
wherein
the adhesive layer is brought in contact with a foreign matter adhering to a chuck part, the adhesive layer is separated from the chuck part to move the foreign matter from the chuck part to the adhesive layer.

2. The cleaner according to claim 1, wherein
the support substrate includes a first region fixed to the first raised portion, a second region fixed to the second raised portion, and a third region having variable distance from the third raised portions; and
a first distance between the third region and the third raised portions in a state where the adhesive layer is separated from the chuck part is longer than the first distance in a state where the adhesive layer and the chuck part are in contact with each other.

3. The cleaner according to claim 2, wherein
the third raised portions have third ends contacting the third region, and
a position of the third ends in a first direction toward the first region from the first raised portion is variable.

4. The cleaner according to claim 1, wherein
the support substrate includes a first region fixed to the first raised portion, a second region fixed to the second raised portion, and a third region having variable distance from the third raised portions;
the first raised portion has a first end contacting the first region,
the second raised portion has a second end contacting the second region,
the third raised portions has a third end contacting the third region,
a position in a first direction toward the first region from the first raised portion, of the third end is disposed between a position in the first direction of the first end and a position in the first direction of the adhesive layer, and
the position in the first direction of the third end is disposed between a position in the first direction of the second end and the position in the first direction of the adhesive layer.

5. The cleaner according to claim 1, wherein
the support substrate includes a first region fixed to the first raised portion, a second region fixed to the second raised portion, and a third region having variable distance from the third raised portions;
the third raised portions have third ends contacting the third region, and a position of the third ends in a first direction toward the first region from the first raised portion is variable.

6. The cleaner according to claim 1, wherein
the chuck part is a reticle chuck of an exposure device.

7. The cleaner according to claim 1, wherein a plurality of protrusions including the first portion, the second raised portion and the third raised portions are provided on the support.

8. The cleaner according to claim 7, wherein each of the protrusions is provided at an equal spacing.

9. A chuck cleaner comprising:
a support including
first and second raised portions disposed at opposed perimeter portions thereof,
a plurality of third raised portions, and
a plurality of recessed portions defined between respective adjacent third raised portions as well as between the first and second raised portions and the third raised portions;
an adhesive layer; and
a support substrate provided between the support and the adhesive layer, the support substrate comprising:
a first region fixed to the first raised portion,
a second region fixed to the second raised portion,
a third region provided between the first region and the second region and having variable distance from the third raised portions,
a fourth region provided between the first region and the third region and separated from the support,
a fifth region provided between the second region and the third region and separated from the support,
a peripheral portion fixed to the first and second raised portions, and
a bottom surface of an inner region adapted to engage an upper surface of each of the third plurality of raised portions in a first orientation and be spaced from the upper surface of each of the third plurality of raised portions in a second orientation;
the adhesive layer being brought in contact with a foreign matter adhering to a chuck part, the adhesive layer being separated from the chuck part to move the foreign matter from the chuck part to the adhesive layer.

* * * * *